(12) United States Patent
Li

(10) Patent No.: US 9,478,649 B2
(45) Date of Patent: Oct. 25, 2016

(54) SEMICONDUCTOR DEVICE

(71) Applicant: Changzhou ZhongMin Semi-Tech Co. Ltd., Changzhou (CN)

(72) Inventor: Yuzhu Li, Jintan (CN)

(73) Assignee: Changzhou ZhongMin Semi-Tech Co., Ltd, Changzhou (CN)

( * ) Notice: Subject to any disclaimer, the term of this patent is extended or adjusted under 35 U.S.C. 154(b) by 0 days.

(21) Appl. No.: 15/016,258

(22) Filed: Feb. 4, 2016

(65) Prior Publication Data

US 2016/0240639 A1    Aug. 18, 2016

Related U.S. Application Data

(60) Provisional application No. 62/112,265, filed on Feb. 5, 2015, provisional application No. 62/126,937, filed on Mar. 2, 2015, provisional application No. 62/126,961, filed on Mar. 2, 2015, provisional application No. 62/148,921, filed on Apr. 17, 2015.

(51) Int. Cl.

| H01L 29/739 | (2006.01) |
|---|---|
| H01L 21/306 | (2006.01) |
| H01L 21/04 | (2006.01) |
| H01L 21/02 | (2006.01) |
| H01L 21/311 | (2006.01) |
| H01L 21/308 | (2006.01) |
| H01L 29/06 | (2006.01) |
| H01L 23/532 | (2006.01) |
| H01L 29/16 | (2006.01) |
| H01L 29/20 | (2006.01) |
| H01L 29/423 | (2006.01) |
| H01L 29/49 | (2006.01) |
| H01L 29/08 | (2006.01) |
| H01L 29/10 | (2006.01) |

(52) U.S. Cl.
CPC ....... *H01L 29/7397* (2013.01); *H01L 21/0217* (2013.01); *H01L 21/02164* (2013.01); *H01L 21/02236* (2013.01); *H01L 21/0475* (2013.01); *H01L 21/3081* (2013.01); *H01L 21/3086* (2013.01); *H01L 21/30604* (2013.01); *H01L 21/31111* (2013.01); *H01L 23/53271* (2013.01); *H01L 29/0696* (2013.01); *H01L 29/0804* (2013.01); *H01L 29/0821* (2013.01); *H01L 29/1095* (2013.01); *H01L 29/16* (2013.01); *H01L 29/1608* (2013.01); *H01L 29/2003* (2013.01); *H01L 29/4236* (2013.01); *H01L 29/4916* (2013.01); *H01L 21/02255* (2013.01)

(58) Field of Classification Search
None
See application file for complete search history.

(56) References Cited

U.S. PATENT DOCUMENTS

| 8,841,175 | B2 * | 9/2014 | Fujii | H01L 29/66348 257/E21.384 |
|---|---|---|---|---|
| 2007/0114570 | A1 * | 5/2007 | Yamaguchi | H01L 29/0696 257/197 |
| 2008/0224207 | A1 * | 9/2008 | Sakamoto | H01L 29/0696 257/331 |
| 2009/0283797 | A1 * | 11/2009 | Takahashi | H01L 29/7397 257/139 |
| 2012/0112241 | A1 * | 5/2012 | Matsushita | H01L 29/7397 257/139 |
| 2016/0111529 | A1 * | 4/2016 | Hirabayashi | H01L 29/1095 257/139 |

* cited by examiner

*Primary Examiner* — Benjamin Sandvik
(74) *Attorney, Agent, or Firm* — Edward S. Sherman

(57) ABSTRACT

A semiconductor device includes: metal collector layer on backside, P-type collector layer, N-type field stop layer, N-drift layer and N-type CS layer within the N-drift layer near the top side. Multiple trench structures are formed by polysilicon core and gate oxide layer near the front side. There are active cells and plugged cells on top of the device. The polysilicon cores of the trenches in the active cells are connected to the gate electrode, and the polysilicon cores of the trenches in the plugged cells are connected to the emitter electrode. There are N+ region and P+ region in active cells, and they are connected to metal emitter layer through the window in the insulation layer. There are P-well regions in both active cells and plugged cells. The P-well regions in active cells are continuous and connected to emitter electrode through P+ region. The P-well regions in plugged cells are divided by N-drift layer, forming discontinuous P-type regions along the direction of trenches. And each P-well region in plugged cells is either electrically floating or connected to the emitter electrode.

20 Claims, 13 Drawing Sheets

SEMICONDUCTOR DEVICE

CROSS REFERENCE TO RELATED APPLICATIONS

The present application claims the benefit of priority to the U.S. Provisional patent application of the same title that was filed on Feb. 5, 2015, having application Ser. No. 62/112,256, and is incorporated herein by reference.

The present application also claims the benefit of priority to the U.S. Provisional patent application of the same title that was filed on Mar. 2, 2015, having application Ser. No. 62/126,937, and is incorporated herein by reference.

The present application also claims the benefit of priority to the U.S. Provisional patent application of the same title that was filed on Mar. 2, 2015, having application Ser. No. 62/126,961, and is incorporated herein by reference.

The present application also claims the benefit of priority to the U.S. Provisional patent application of the same title that was filed on Apr. 17, 2015, having application Ser. No. 62/148,921, and is incorporated herein by reference.

BACKGROUND OF INVENTION

1. Field of the Invention

The present invention relates to power semiconductor devices, especially to MOS (metal-oxide-semiconductor) controlled bipolar device, including Insulated Gate Bipolar Transistor (IGBT).

2. Related Background Art

MOS (metal-oxide-semiconductor) controlled bipolar device is the preferred device for high power applications, capable of providing high blocking voltage and high conducting current and can be controlled conveniently by MOS (metal-oxide-semiconductor) gate. As a MOS controlled bipolar device, IGBT is the main-stream device for high power applications. There are many different IGBT structures with different performances. CSTBT structure has been proposed as an advanced IGBT structure. In the CSTBT structure, a relatively high concentration N-type CS (carrier stored) layer is formed under P-well, as disclosed in published conference paper ("Carrier Stored Trench-Gate Bipolar Transistor (CSTBT)—A Novel Power Device for High Voltage Application", H. Takahashi, et al., the 8th International Symposium on Power Semiconductor Devices and ICs 1996, pp 349-352, IEEE). This way, carrier density in forward conduction mode is increased and collector-emitter saturation voltage (Vcesat) is decreased.

Plugged cell structure has been proposed for CSTBT. By adding plugged cells, miller capacitance can be reduced and short circuit current oscillation can be suppressed, as disclosed in U.S. Pat. No. 6,953,968 and U.S. Pat. No. 8,507,945 (which issued to Nakamura et al. on Oct. 11, 2005 and Aug. 13, 2013 respectively) which is incorporated herein by reference and is hereinafter referred to as the '968 patent and '945 patent respectively.

A typical CSTBT structure described in the '968 patent and '945 patent with plugged cells described above is shown in FIG. 1. This structure includes: metal collector layer 13 on backside, P-type collector layer 12, N-type field stop layer 11 and N-drift layer 10, which is a lightly doped N-type layer. There are active cells 40 and plugged cells 50 on top of the device. The active cell 40 and plugged cell 50 are separated by a trench 38. The gate trench structure 37 is formed of a polysilicon core 6 which is surrounded by a gate oxide layer 9. Polysilicon core 6 is connected to gate electrode 30. The trench structures 38 of plugged cells are formed by polysilicon core 3 which is surrounded by gate oxide layer 9. Polysilicon 3 and metal emitter layer 5 are both connected to the emitter electrode. Besides the trenches in both active cells and plugged cells, there are P-type wells 7a/7b and N-type CS layers 8. P-well 7b in plugged cells are not connected to any electrode, thus they are floating. Above P-well 7a in the active cell, there are N+ emitter layer 1, which is a heavily doped N-type layer, and P+ contact layer 2, which is a heavily doped P-type layer, and they are connected to metal emitter layer 5 through the opening 20 in the insulation layer 4.

In plugged cells of device structure shown in FIG. 1, a PN junction is formed between P-wells 7a/7b and N-type CS layers 8. Although P-wells 7b are floating, this PN junction still contains built-in depletion regions. These depletion regions reduce the stored carrier concentration in forward conduction mode, thus the $V_{cesat}$ is relatively high.

To overcome the above mentioned problems, an improved plugged cell structure for CSTBT has been proposed, as disclosed in Chinese patent application No. 201410199352.4 (which is accepted on May 13, 2014) which is incorporated herein by reference and is hereinafter referred to as the '352.4 patent. The characteristics is that the P-wells in plugged cells are completely removed as shown in FIG. 2, thus the carrier density in forward conduction mode is further increased and collector-emitter saturation voltage ($V_{cesat}$) is further decreased. This structure comprises: metal collector layer 13 on the device backside, P-type collector layer 12, N-type field stop layer 11 and N-drift layer 10, which is a lightly doped N-type layer. There are active cells 40 and plugged cells 50 on top of the device. The active cell 40 and plugged cell 50 are separated by a trench 38. The gate trench structure 37 is formed of a polysilicon core 6 which is surrounded by a gate oxide layer 9. Polysilicon core 6 is connected to gate electrode 30. The trench structures 38 of plugged cells are formed by polysilicon core 3 which is surrounded by gate oxide layer 9. Polysilicon 3 and metal emitter layer 5 are both connected to emitter electrode. There are P-type wells 7 and N-type CS layers 8 in active cells. In plugged cells, there are N-type CS layers 8 but no P-type wells 7. Above P-well 7 in the active cell, there are N+ emitter layer 1, which is a heavily doped N-type layer, and P+ contact layer 2, which is a heavily doped P-type layer, and they are connected to metal emitter layer 5 through the opening 20 in the insulation layer 4.

In contrast to the Device in FIG. 1, the FIG. 2 device has a no floating P-wells 7b in the plugged cells, so built-in depletion regions between floating P-wells 7b and N-type CS layers 8 are removed, resulting in higher stored carrier concentration and a lower Vcesat. However, due to the lack of these built-in depletion regions, the recombination process of stored carrier is slowed down, therefore the turnoff process is also slowed down and turnoff energy is noticeably increased. Thus, the Vcesat of FIG. 2 structure is lower than that of FIG. 1 structure, but the turnoff energy of FIG. 2 structure is higher than that of FIG. 1 structure.

Therefore, what is needed is a new design of IGBT structure to achieve better performance tradeoff between Vcesat and turnoff energy.

The above and other objects, effects, features, and advantages of the present invention will become more apparent from the following description of the embodiments thereof taken in conjunction with the accompanying drawings

SUMMARY OF INVENTION

According to first aspect of the present invention there is provided a semiconductor device having a front side and a back side opposing the front side, which comprises a metal collector layer on the backside, a layered semiconductor material disposed on the metal collector layer being selectively doped to provide; a first P-type collector layer disposed on the metal collector layer, an N-type field stop layer disposed on the P-type collector layer, an lightly doped N-type drift layer disposed on the N-type stop layer, and an N-type CS layer disposed within the N-type drift layer close to front side, a plurality of trenches having conductive core that is surrounded by gate oxide layer, that extend at least partially within the N-drift layer and CS layer; wherein some of the trenches having conductive cores connected to emitter electrode and bounding the region proximal to the front side of the device into a plugged cell region; wherein the rest of the region proximal to the front side of the device forming an active cell region and the conductive core of trenches in the active cell region being connected to gate electrode, an insulation layer at least partially covering the N-drift layer and trenches formed therein, a metal emitter layer disposed on the insulation layer and connected through a window in the insulation layer to the active cells region, which comprise: one or more N+ region alternating with a plurality of P+ regions, a first P-well region disposed between the alternating N+ and P+ regions and the N-drift layer, the first P-well regions in active cells being continuous and connected to the metal emitter electrode through the P+ regions, wherein the plugged cell region comprises a plurality of second P-well regions that are discontinuous and electrically floating.

According to the second aspect of the present invention, the semiconductor device described above further comprises floating N+ and floating P+ regions within the floating P-well regions According to a third aspect of the present invention, the semiconductor device described above, wherein the floating P-well regions in plugged cells can be placed in a straight line or placed in arbitrary pattern.

According to the fourth aspect of the present invention, the semiconductor device described above further comprises polysilicon-bridge over the plugged cell, wherein the polysilicon-bridge being connected to emitter electrode. And there are holes in the polysilicon-bridge above the floating P-well region.

According to the fifth aspect of the present invention, the semiconductor device described above further comprises heavily doped N-type region inside P-type collector layer, forming so called "reverse conducting IGBT".

According to the sixth aspect of the present invention, the semiconductor device described above removes field stop layer, and further comprises floating P-rings 15 used for junction termination and the backside P-type collector 12 wraps up to front side to achieve reverse-blocking capability.

According to the seventh aspect of the present invention, the semiconductor device described above, wherein at least some of the second P-well regions in plugged cells are connected to the Emitter electrode.

The above and other objects, effects, features, and advantages of the present invention will become more apparent from the following description of the embodiments thereof taken in conjunction with the accompanying drawings.

DETAILED DESCRIPTION

Figure 1:
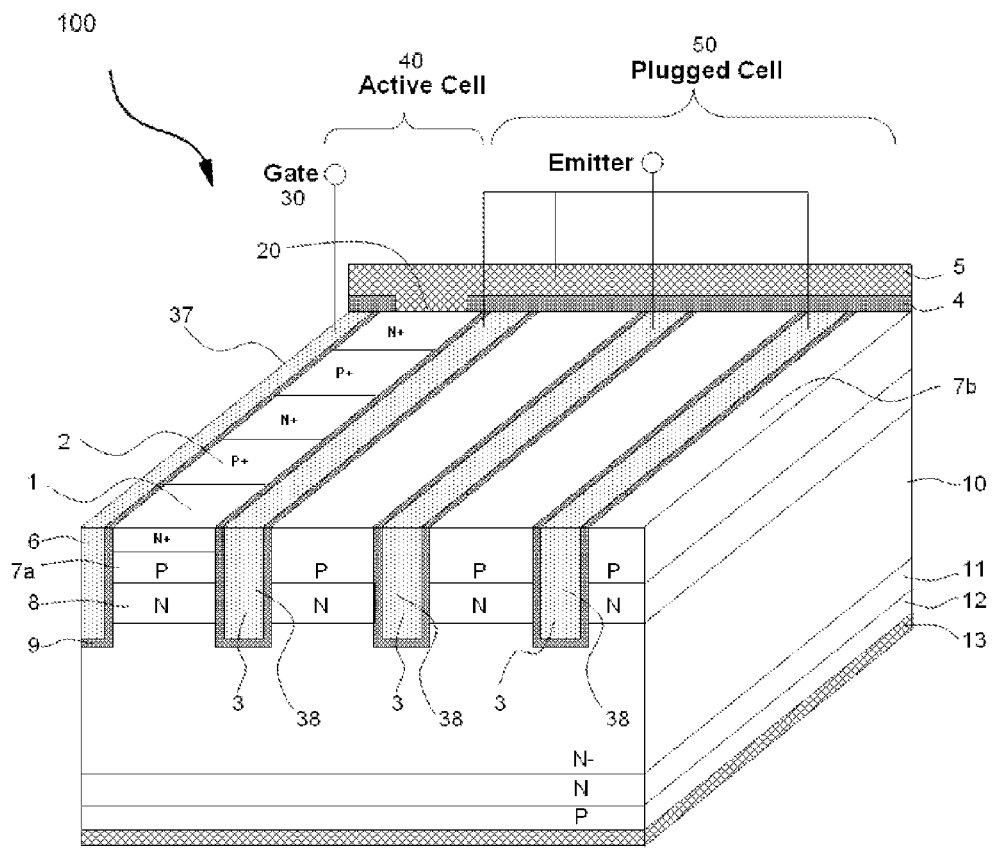
FIG. 1 is a schematic view of a prior art IGBT structure.

Referring to FIGS. 1 through 13, wherein like reference numerals refer to like components in the various views, there is illustrated therein a new and improved insulated gate bipolar device, generally denominated 100 herein.

Some embodiments of the present invention will be described hereafter with reference to the drawings. Drawing FIG. 1-6 and FIG. 10-11 are partial cut-away perspective views of a semi-conductor device in which the upper layers of the emitter and/or gate and planar insulating layer are shown schematically in section only to better reveal the underlying structure. No intent is made to illustrate specific size or proportions, as these will be well understood by those skilled in the art of such semi-conductor devices with the aid of the following descriptions.

Figure 3:
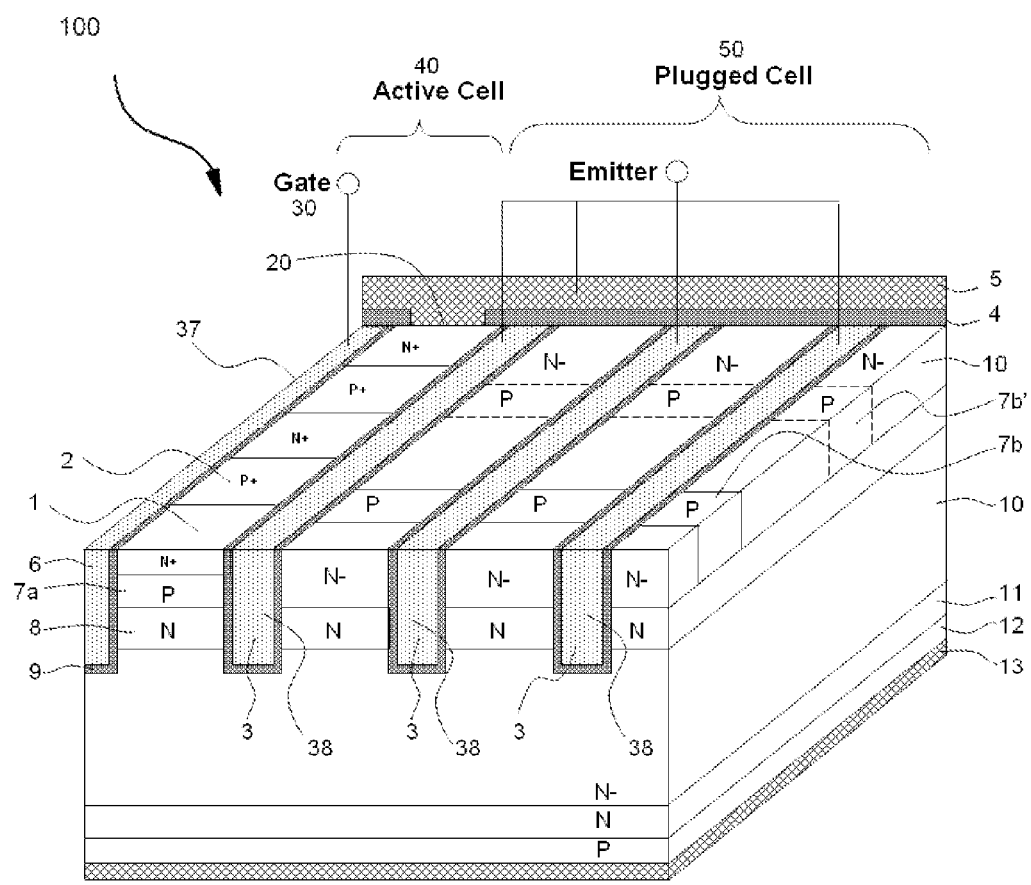
FIG. 3 is a schematic view of a first embodiment of the present invention.

FIG. 3 is the schematic view of first embodiment of a semiconductor device 100 according to the present invention. This device 100 comprises: a metal collector layer on backside 13, P-type collector layer 12, N-type field stop layer 11 and N-drift layer 10, which is a lightly doped N-type layer. There are active cells 40 and plugged cells 50 on top of the device. The active cell 40 and plugged cell 50 are separated by a trench 38. The trench structure 37 of active cells is formed of a polysilicon core 6 which is surrounded by a gate oxide layer 9. The polysilicon core 6 is connected to gate electrode 30. The trench structures 38 of plugged cells are formed by polysilicon core 3 which is surrounded by gate oxide layer 9. Polysilicon 3 and metal emitter layer 5 are both connected to emitter electrode. Besides the trenches in both active cells and plugged cells, there are N-type CS layers 8. The P-well regions 7a and 7b are formed simultaneously both in the active cells and plugged cells. Above P-well 7a in the active cell, there are N+ emitter layer 1, which is a heavily doped N-type layer, and P+ contact layer 2, which is a heavily doped P-type layer, and they are connected to metal emitter layer 5 through the opening 20 in the insulation layer 4. The P-well region 7b in plugged cells forms discontinuous, isolated region and is electrically floating. P-well 7b in plugged cells are not connected to any electrode, thus they are floating. The plugged cells may contain multiple P-wells regions 7b, in which optional additional cell 7b' is shown in broken lines, which can be repeated in the direction of the trenches 38.

The characteristics of above mentioned device lie in that the one or more floating P-well 7b in plugged cells forms discontinuous, isolated region and is electrically floating.

Figure 4:
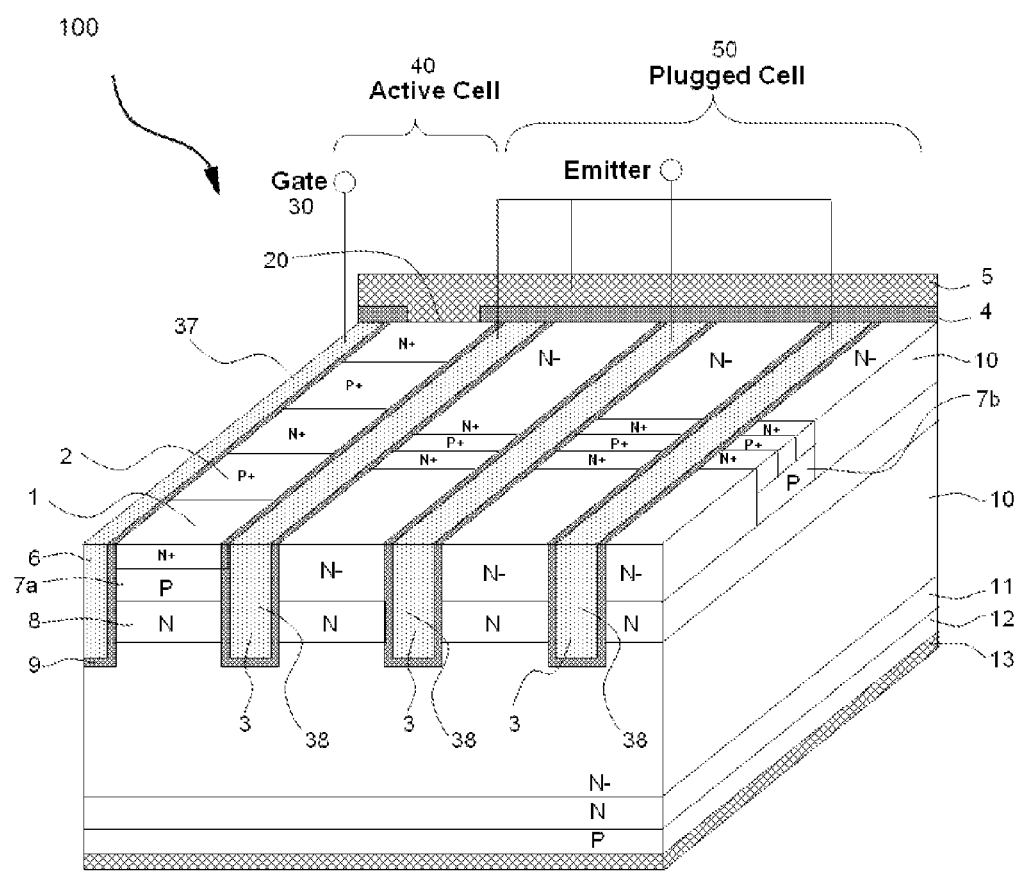
FIG. 4 is a schematic view of a second embodiment of the present invention.

FIG. 4 is the schematic view of second embodiment of a semiconductor device according to the present invention. Floating N+ and floating P+ regions are placed above the floating P-well regions 7b, but are optionally placed with the floating P-well regions.

Figure 5:
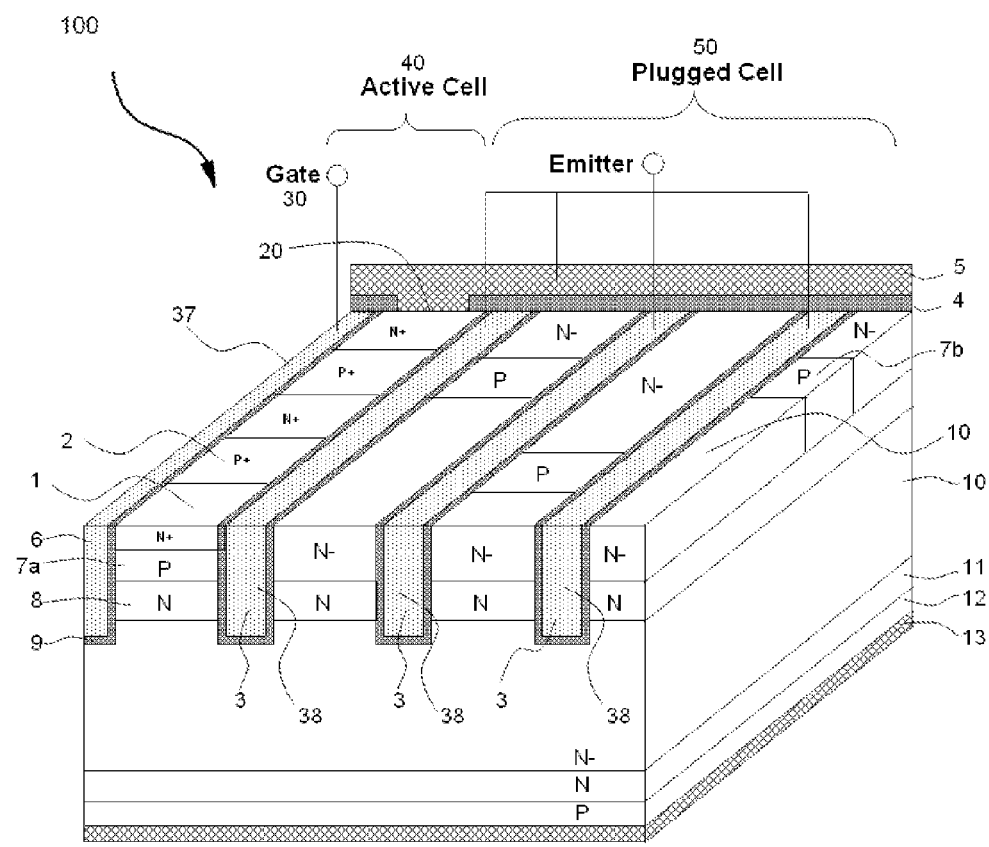
FIG. 5 is a schematic view of a third embodiment of the present invention.

FIG. 5 is the schematic view of third embodiment of a semiconductor device according to the present invention. The floating P-well regions 7b in plugged cells are placed in a quite arbitrary pattern instead of in a straight line pattern.

Figure 6:
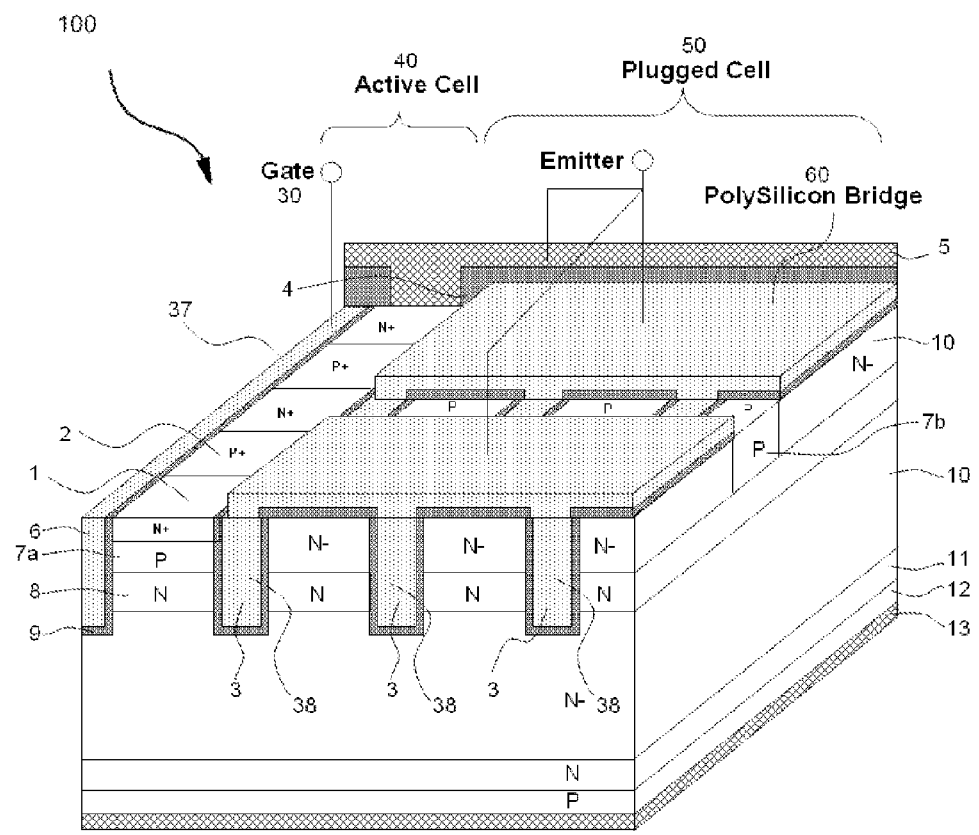
FIG. 6 is a schematic view of a fourth embodiment of the present invention.

FIG. 6 is the schematic view of fourth embodiment of a semiconductor device according to the present invention. At least one polysilicon-bridge 60 is placed over the plugged cell 50 to connect the polysilicon cores of the multiple adjacent trenches 38. An insulating $SiO_2$ layer is disposed between the polysilicon bridge and the upper most lightly doped N-type drift layers.

There are holes in the polysilicon-bridge 60 above the floating P-well region 7b. The polysilicon-bridge 60 is connected to emitter electrode. The advantage of using this polysilicon-bridge 60 is that the polysilicon-bridge 60 can be used as a self-aligned mask for implant process to fabricate P-well 7b, thus saving an additional mask for fabricating P-well 7b. It is preferable that a single polysilicon bridge connects the core of each trench along the length thereof, having holes or gaps at the location of the P-well in the plugged cells, as well as any N+/P+/N alternating structures also disposed in or above the adjacent a P-well, such as in FIG. 4.

All structures shown in FIG. 1-6 belong to "field-stop IGBT" devices. However, this invention is not limited in field-stop IGBT, and can be applied in all MOS-controlled bipolar devices, including but are not limited by: PT-IGBT, NPT-IGBT, field-stop IGBT, reverse-conducting IGBT, reverse-blocking IGBT, MOS-controlled thyristor.

Figure 10:
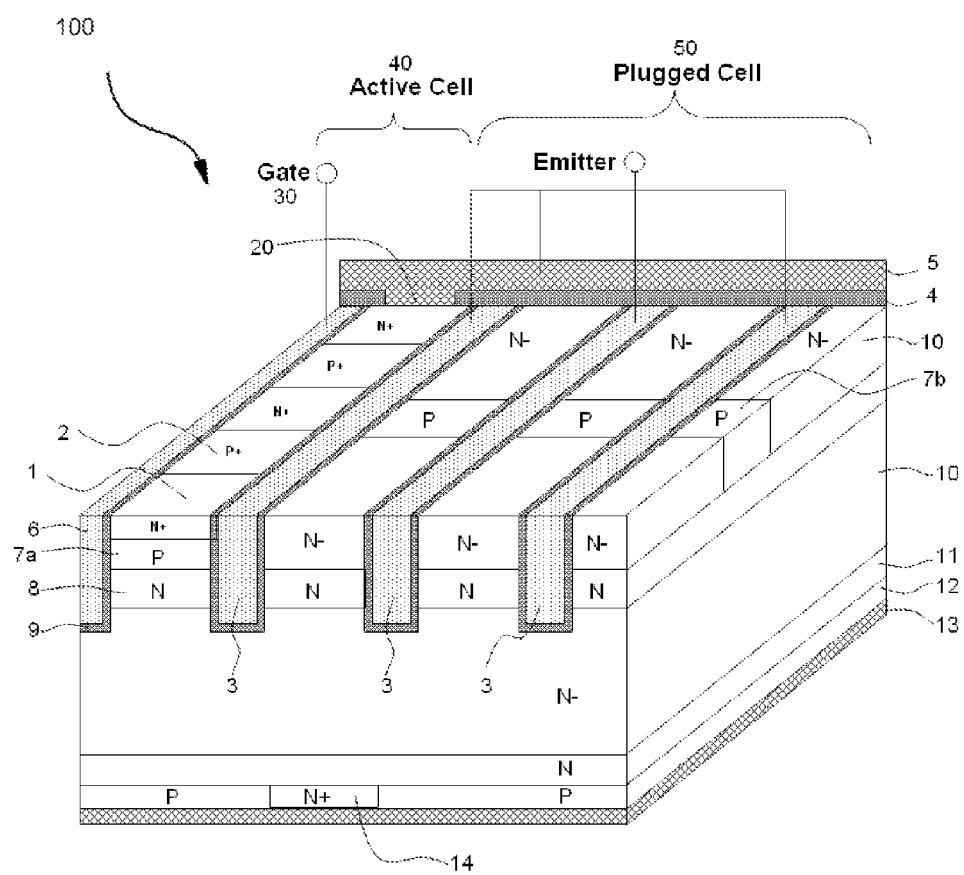
FIG. 10 is a schematic view of a fifth embodiment of the present invention.

FIG. 10 is a schematic view of the fifth embodiment of the present invention. The device contains N+ backside emitter region 14 placed inside P-type collector layer 12. This structure belongs to "reverse conducting IGBT" device.

Figure 11:
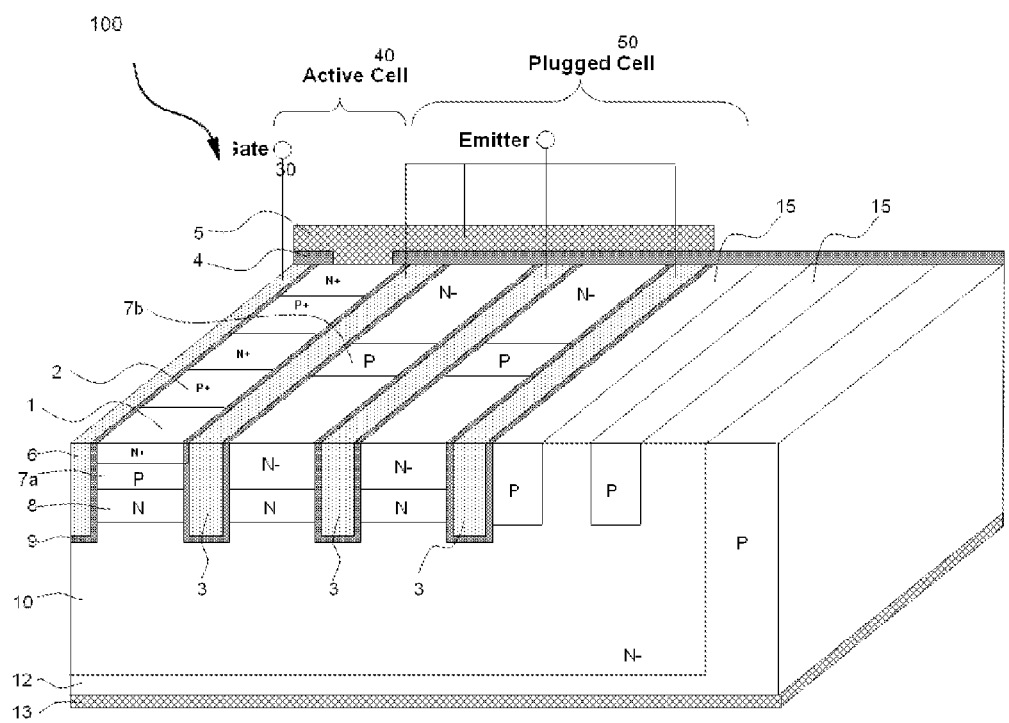
FIG. 11 is a schematic view of a sixth embodiment of the present invention.

FIG. 11 is a schematic view of the sixth embodiment of the present invention.

The device removes field stop layer 11, and contains floating P-rings 15 used for junction termination and the backside P-type collector 12 that wraps up to front side to achieve reverse-blocking capability, and thus surrounds the floating P-rings 15 on the side opposite the plugged cell region 50. This structure belongs to "reverse blocking IGBT" type device.

Figure 12:
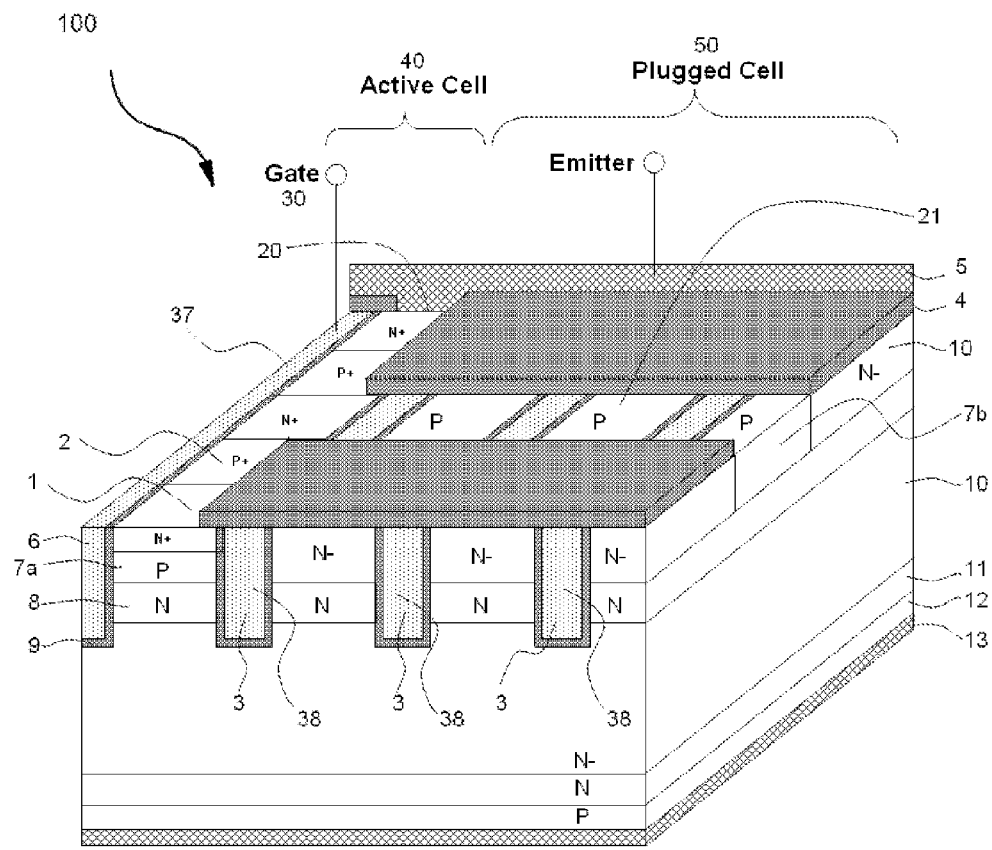
FIG. 12 is a schematic view of a seventh embodiment of the present invention.

FIG. 12 is a schematic view of the seventh embodiment of the present invention, which is substantially similar to the inventive structure of FIG. 3, except that at least some of the second P-well regions 7b in plugged cells are connected to the metal emitter layer 5 through the opening 21 in the insulation layer 4.

The qualitative analysis of the structure of the present invention is the following.

In the structure shown in FIG. 1, PN junctions are formed between P-wells 7b and N-type CS layers 8. Although P-wells 7b are floating, this PN junction still contains built-in depletion regions. These depletion regions reduced the stored carrier concentration in forward conduction mode, thus the $V_{cesat}$ is relatively high. During the turnoff process, these depletion regions accelerate the recombination of stored carriers and thus the turnoff energy is relatively low.

Figure 2:
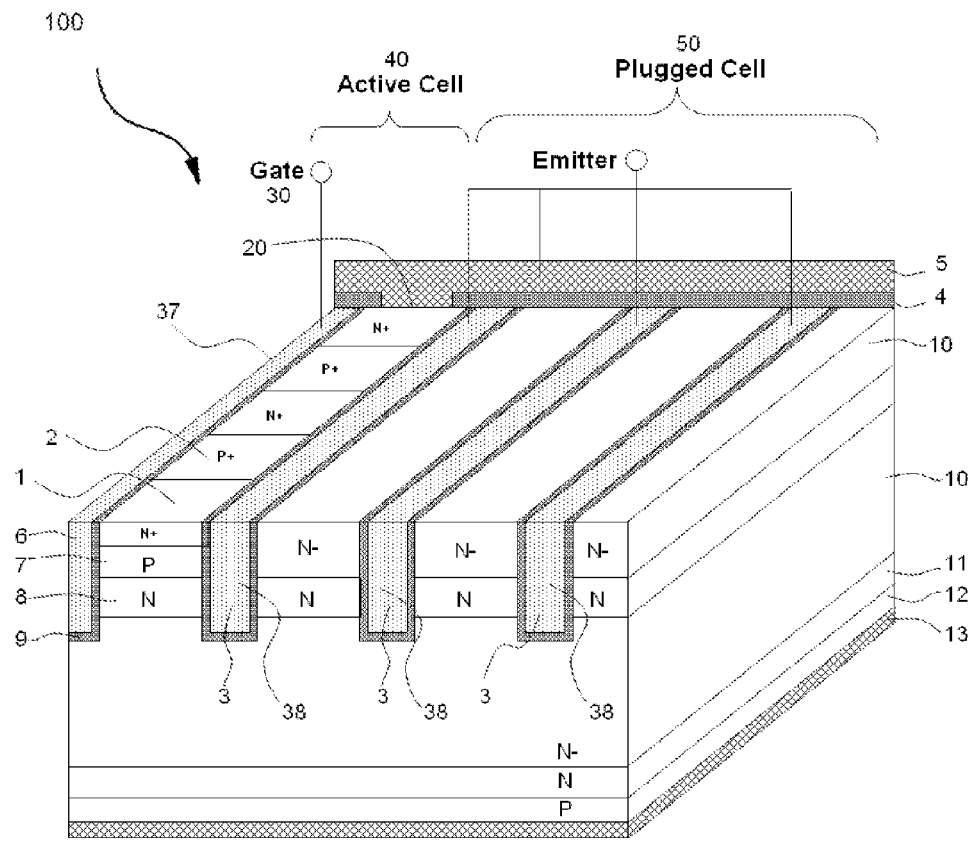
FIG. 2 is a schematic view of another prior art IGBT structure.

There are no floating P-wells 7b in the plugged cells in the structure shown in FIG. 2, so built-in depletion regions between P-wells 7b and N-type CS layers 8 are removed, resulting in higher stored carrier concentration and a lower $V_{cesat}$. But the turnoff process is also slowed down and turnoff energy is noticeably increased.

In the structure of the present invention shown in FIG. 3, P-wells 7b in the plugged cells partially remains and becomes discontinuous, divided by N-drift layers 10 along the direction of trenches. So the areas of built-in depletion regions between P-wells 7b and N-type CS layers 8 in the structure of FIG. 3 are reduced compared with FIG. 1 structure, thus the stored carrier concentration is higher than that of FIG. 1 structure and the $V_{cesat}$ is lower than that of FIG. 1 structure. At the same time, the discontinuous built-in depletion regions between P-wells 7b and N-type CS layers 8 in the structure of FIG. 3 still can accelerate the recombination of stored carriers and the turnoff energy is lower than that of FIG. 2 structure.

To compare the performance of the three different structures quantitatively, three-dimensional numeric simulations on forward conduction mode were carried out on the three IGBT structures (the Prior art structure shown in FIG. 1 and FIG. 2 and the inventive structure of FIG. 3). Although all three structures can be used for IGBT of all voltage ratings, only IGBT structures rated at 1200V were used in the simulations as an example. All three structures in the simulations had same topologies and adopted same parameters for all corresponding layers.

Figure 7:
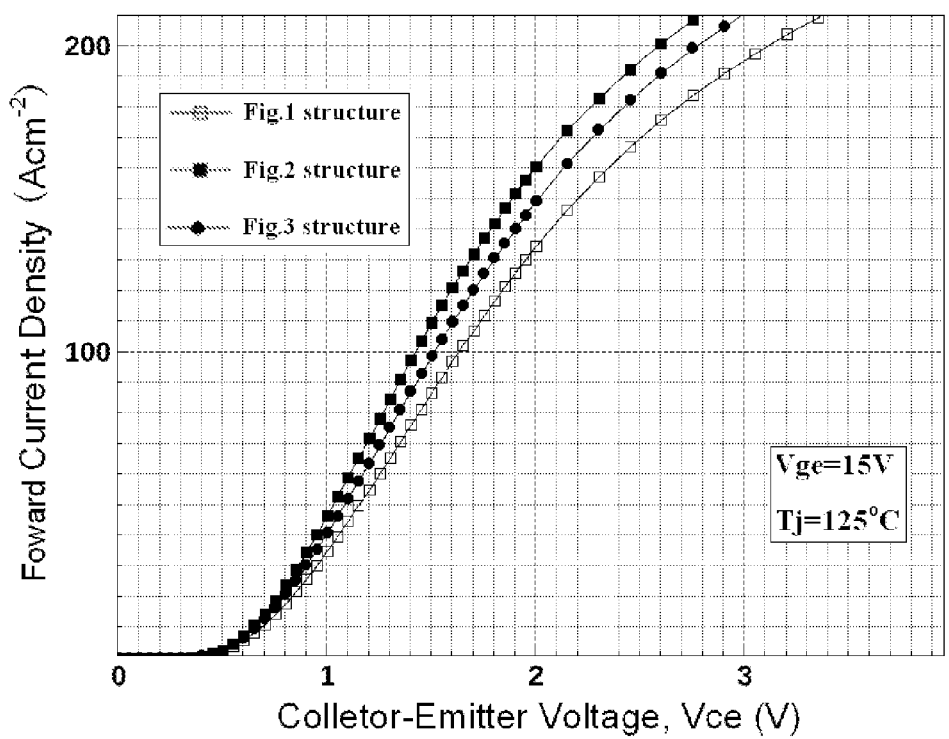
FIG. 7 is the comparison of forward I-V curves of three IGBT structures (FIG. 1 structure, FIG. 2 structure and FIG. 3 structure)

FIG. 7 is the comparison of forward I-V curves of the three IGBT structures (the Prior art structure shown in FIG. 1 and FIG. 2 and the inventive structure of FIG. 3). The junction temperature (Tj) of all three structures was set at 125° C., and Vcesat was measured at forward current density of 150 $Acm^{-2}$.

Vcesat values are listed in the following table.

|  | FIG. 1 structure (Prior art) | FIG. 2 structure (Prior art) | FIG. 3 structure |
| --- | --- | --- | --- |
| Vcesat | 2.2 V | 1.88 V | 2.0 V |

It can be seen that the $V_{cesat}$ of this invention is significantly lower (0.2V) than the Prior art FIG. 1 structure. And in fact, the $V_{cesat}$ of this invention is quite close to the $V_{cesat}$ of the Prior art FIG. 2 structure (higher by 0.12V).

Figure 8:
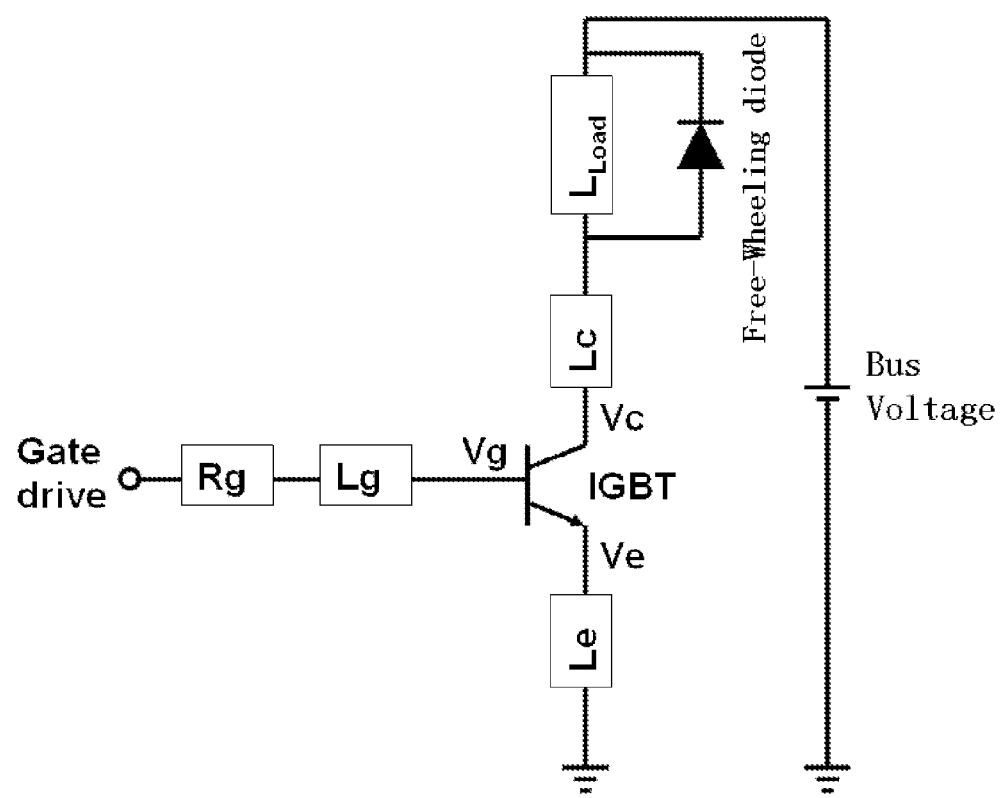
FIG. 8 is the hard switching circuit used in the simulation.

Three-dimensional numeric simulations on turnoff process were also carried out for the three structures. FIG. 8 shows the hard switching circuit used in the simulation. This circuit comprises IGBT and free-wheeling diode, load inductor ($L_{Load}$) and high voltage bus. The gate of the IGBT is controlled by gate driver through gate resistor ($R_g$). The circuit also comprises parasitic inductors ($L_g$, $L_c$ and $L_e$).

Figure 9:
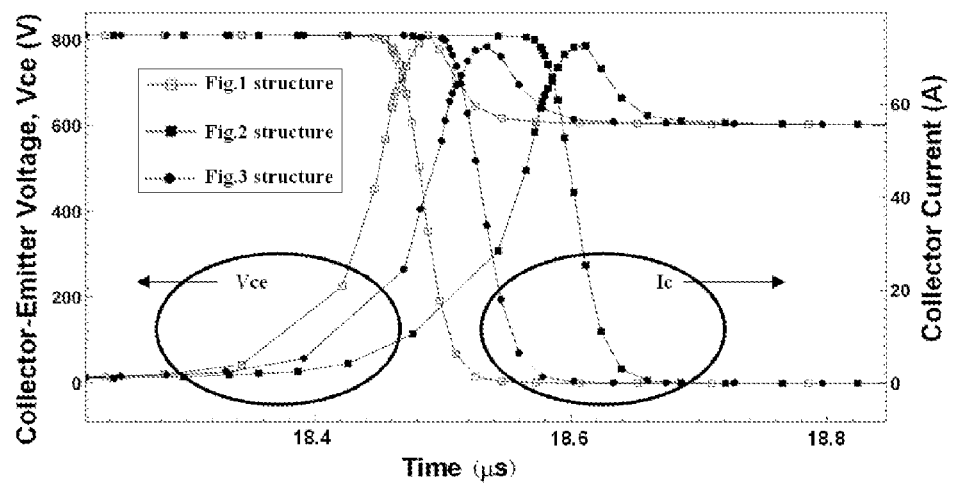
FIG. 9 is the comparison of turnoff waveforms of three IGBT structures (FIG. 1 structure, FIG. 2 structure and an embodiment of this invention)

FIG. 9 is the comparison of the turnoff waveforms of three IGBT structures (the Prior art structure shown in FIG. 1 and FIG. 2 and the inventive structure of FIG. 3). All structures simulated have same chip active area of 0.5 $cm^2$. The bus voltage was set at 600V and the load current was set at 75 A. The free-wheeling diode structure used in the simulations is the same. The gate resistor is kept at 15 ohms. The junction temperature of all semiconductor devices used in the simulation was set at 125° C.

Turnoff process performance, including turnoff energy (Eoff) and Vce peak voltage are listed in the following table.

|  | FIG. 1 structure (Prior art) | FIG. 2 structure (Prior art) | FIG. 3 structure |
|---|---|---|---|
| Eoff | 3.884 mJ | 4.565 mJ | 4.195 mJ |
| Vce peak | 812.1 V | 786.9 V | 784.7 V |

It can be seen that turnoff energy of this invention is only 8% higher than that of the Prior art FIG. 1 structure, while turnoff energy of the Prior art FIG. 2 structure is 17.5% higher than that of the Prior art FIG. 1 structure. Besides, the Vce peak voltage of this invention is the lowest, resulting in an improved robustness.

In the structure of the present invention shown in FIG. 12, which is substantially similar to the inventive structure of FIG. 3, except that at least some of the P-wells 7b in the plugged cells are connected to the emitter electrode. The metal emitter layer 5 extends over the cores 3 of the trenches 38 and the plugged cells 7b that are exposed by the opening or gap 21 in the insulation layer 4.

Figure 13:
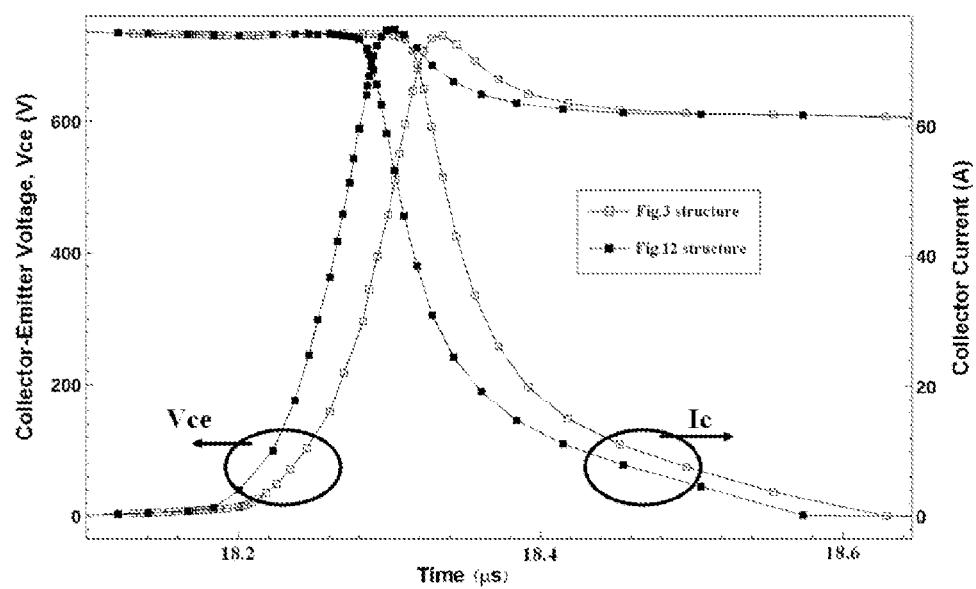
FIG. 13 is the comparison of turnoff waveforms of two IGBT structures (FIG. 3 structure and FIG. 12 structure).

These connected P-wells 7b provided additional paths for stored carriers to flow to the Emitter electrode, accelerating the turnoff process of the device and reducing turnoff energy compared to the structure of FIG. 3. Three-dimensional numeric simulations on turnoff process were also carried out for the two structures. FIG. 13 is the comparison of the turnoff waveforms of two IGBT structures (the inventive structure of FIG. 3 and the inventive structure of FIG. 12). It can be seen that turnoff process of the inventive structure of FIG. 12 is a little faster than that of the inventive structure of FIG. 3, with the turnoff energy reduced by roughly 6%.

Although the present invention has been described in relation to particular embodiments thereof, many other variations and modifications and other uses will become apparent to those skilled in the art. For example, although the ratio between the number of trenches in active cells and the number of trenches in plugged cells in FIG. 1-6 and FIG. 10-11 is the same 0.5:3 (that is, 1:6), this ratio can be adjusted by design requirement. Further, any of the P and N type semiconductor material in the inventive device can be selected from the group of materials that consist of silicon, silicon carbide and gallium nitride. While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

I claim:

1. A semiconductor device having a front side and a back side opposing the front side, which comprises:
    a) a metal collector layer on the backside,
    b) a layered semiconductor material disposed on the metal collector layer being selectively doped to provide;
        i. a first P-type collector layer disposed on the metal collector layer,
        ii. an N-type field stop layer disposed on the P-type collector layer; and
        iii. a lightly doped N-type drift layer disposed on the N-type stop layer,
        iv. an N-type CS layer disposed within the N-type drift layer close to front side,
    c) a plurality of trenches having a conductive core that is surrounded by gate oxide layer, that extend at least partially within the N-drift layer and N-type CS layer; wherein some of the trenches having conductive cores connected to emitter electrode and bounding the region proximal to the front side of the device into a plugged cell region; wherein the rest of the region proximal to the front side of the device forms an active cell region and the conductive core of trenches in the active cell region is connected to gate electrode,
    d) an insulation layer at least partially covering the N-drift layer and the trenches formed therein,
    e) a metal emitter layer disposed on the insulation layer and connected through a window in the insulation layer to the active cells region, which comprises:
        i. one or more N+ region alternating with a plurality of P+ regions,
        ii. a first P-well region disposed between the alternating N+ and P+ regions and the N-type CS layer, the first P-well regions in active cells being continuous and connected to the metal emitter electrode through the P+ regions,
    f) wherein the plugged cell region comprises one or more second P-well regions that are discontinuous and each second P-well region is either electrically floating or connected to the emitter electrode.

2. The semiconductor device according to claim 1, which further comprises N+ and P+ regions within or above the second P-well regions.

3. The semiconductor device according to claim 2, wherein the second P-well regions are placed in arbitrary pattern in the portions of the plugged cells disposed between the trenches.

4. The semiconductor device according to claim 3, wherein the second P-well regions are placed in arbitrary pattern in the portions of the plugged cells disposed between the trenches.

5. The semiconductor device according to claim 1, which further comprises at least one polysilicon-bridge disposed between the plugged cell region and a portion of the insulating layer to overlay the discontinuous second P-well regions, wherein the polysilicon-bridge being connected to emitter electrode.

6. The semiconductor device according to claim 2, which further comprises at least one polysilicon-bridge disposed between the plugged cell region and a portion of the insulating layer to overlay the discontinuous second P-well regions, wherein the polysilicon-bridge being connected to emitter electrode.

7. The semiconductor device according to claim 3, which further comprises at least one polysilicon-bridge disposed between the plugged cell region and a portion of the insulating layer to overlay the discontinuous second P-well regions, wherein the polysilicon-bridge being connected to emitter electrode.

8. The semiconductor device according to claim 5 further comprising holes in the polysilicon-bridge.

9. The semiconductor device according to claim 6 further comprising holes in the polysilicon-bridge.

10. The semiconductor device according to claim 1, which further comprises at least one heavily doped N+ region subdividing the P-type collector layer, the heavily doped N+ region having an upper portion in contact with the N-type field stop layer and an opposing lower portion in contact with the metal collector layer.

11. The semiconductor device according to claim 2, which further comprises at least one heavily doped N+ region subdividing the P-type collector layer, the heavily doped N+ region having an upper portion in contact with the N-type field stop layer and an opposing lower portion in contact with the metal collector layer.

12. The semiconductor device according to claim 3, which further comprises at least one heavily doped N+ region subdividing the P-type collector layer, the heavily doped N+ region having an upper portion in contact with the N-type field stop layer and an opposing lower portion in contact with the metal collector layer.

13. The semiconductor device according to claim 1, wherein the ratio between the number of trenches in active cells and the number of trenches in plugged cells in can be adjusted by design requirement.

14. The semiconductor device according to claim 1, wherein the semiconductor device has P and N material selected from the group consisting of silicon, silicon carbide and gallium nitride.

15. The semiconductor device according to claim 2, wherein the semiconductor device has P and N material selected from the group consisting of silicon, silicon carbide and gallium nitride.

16. The semiconductor device according to claim 3, wherein the semiconductor device has P and N material selected from the group consisting of silicon, silicon carbide and gallium nitride.

17. The semiconductor device according to claim 1 wherein the conductive core of the gate trench is polysilicon.

18. The semiconductor device according to claim 2 wherein the conductive core of the gate trench is polysilicon.

19. The semiconductor device according to claim 3 wherein the conductive core of the gate trench is polysilicon.

20. A semiconductor device having a front side and a back side opposing the front side, which comprises:
   a) a metal collector layer on the backside,
   b) a layered semiconductor material disposed on the metal collector layer being selectively doped to provide;
      i. a first P-type collector layer disposed on the metal collector layer,
      ii. a lightly doped N-type drift layer disposed on the P-type collector layer; and
      iii. an N-type CS layer disposed within the N-type drift layer close to front side,
   c) a plurality of trenches having conductive core that is surrounded by gate oxide layer, that extend at least partially within the N-drift layer and N-type CS layer;
   wherein at least some of the trenches have conductive cores connected to emitter electrode and bounding the region proximal to the front side of the device into a plugged cell region; wherein the rest of the region proximal to the front side of the device forms an active cell region and the conductive core of trenches in the active cell region is connected to gate electrode,
   d) an insulation layer at least partially covering the N-drift layer and the trenches formed therein,
   e) a metal emitter layer disposed on the insulation layer and connected through a window in the insulation layer to the active cells region, which comprises:
      i. one or more N+ region alternating with a plurality of P+ regions,
      ii. a first P-well region disposed between the alternating N+ and P+ regions and the N-type CS layer, the first P-well regions in active cells being continuous and connected to the metal emitter electrode through the P+ regions,
   f) wherein the plugged cell region comprises one or more second P-well regions that are discontinuous and each second P-well region is either electrically floating or connected to the emitter electrode, and
   g) at least one floating P-ring region within the N-drift layer on the front side and the backside P-type collector layer wraps up to the front side to extend beyond the floating P-ring regions.

* * * * *